(12) United States Patent
Sogawa et al.

(10) Patent No.: US 7,755,207 B2
(45) Date of Patent: Jul. 13, 2010

(54) WAFER, RETICLE, AND EXPOSURE METHOD USING THE WAFER AND RETICLE

(75) Inventors: Koichi Sogawa, Hyogo (JP); Kiyoshi Yano, Hyogo (JP); Tohru Haruki, Hyogo (JP); Hidetsugu Miyake, Hyogo (JP); Shouji Tochishita, Hyogo (JP); Minoru Ohtomo, Hyogo (JP); Kenji Nishihara, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 532 days.

(21) Appl. No.: 11/363,841

(22) Filed: Feb. 28, 2006

(65) Prior Publication Data
US 2007/0023932 A1 Feb. 1, 2007

(30) Foreign Application Priority Data
Jul. 27, 2005 (JP) ............................. 2005-217249

(51) Int. Cl.
*H01L 23/544* (2006.01)

(52) U.S. Cl. ............... 257/797; 257/620; 257/E23.179; 438/462

(58) Field of Classification Search .......... 257/E23.179, 257/620, 797
See application file for complete search history.

(56) References Cited

U.S. PATENT DOCUMENTS
5,640,053 A * 6/1997 Caldwell ................... 257/797
7,057,301 B1 * 6/2006 Fasen ......................... 257/798
2005/0282360 A1 * 12/2005 Kida et al. .................. 438/462

FOREIGN PATENT DOCUMENTS
| JP | 10-288835 | 10/1998 |
| JP | 2001-44105 | 2/2001 |
| JP | 2001-135569 | 5/2001 |
| JP | 2003-59805 | 2/2003 |
| JP | 2003-255507 | 9/2003 |
| JP | 2004-317975 | 11/2004 |

OTHER PUBLICATIONS
Feb. 19, 2008 Japanese official action in connection with corresponding Japanese patent application No. 2005-217249.

* cited by examiner

*Primary Examiner*—Kenneth A Parker
*Assistant Examiner*—Jose R Diaz
(74) *Attorney, Agent, or Firm*—Cooper & Dunham LLP

(57) ABSTRACT

A semiconductor wafer is disclosed that includes a substrate; a plurality of device chip areas formed on the substrate; a plurality of scribe lines formed in a lattice-like manner on the substrate, the scribe lines being provided so as to separate the device chip areas from each other; a blank area in which at least one alignment mark formed of a metal film for alignment of the semiconductor wafer is formed, the blank area being provided in an area different from the device chip areas; and a scribe area in which the alignment mark is prevented from existing, the scribe area being provided in each area where the blank area crosses the scribe lines.

17 Claims, 5 Drawing Sheets

WAFER, RETICLE, AND EXPOSURE METHOD USING THE WAFER AND RETICLE

BACKGROUND

1. Technical Field

This disclosure relates to a wafer, a reticle, and an exposure method using the wafer and reticle for exposing multiple chip areas formed on the wafer.

2. Description of the Related Art

In general, in a semiconductor device including an analog circuit, laser trimming is performed in order to improve its analog characteristics. In this laser trimming process, one method of aligning a semiconductor wafer and adjusting its angle ($\theta$) is, for example, to provide an alignment mark formed of a conductive material such as aluminum or an aluminum alloy in an area other than the exposure area on the wafer, such as a scribe line, and aligning the wafer and adjusting its angle using this alignment mark. As another method, multiple TEG (Test Element Group) chips for measuring the electric characteristics of semiconductor devices are provided, and $\theta$ adjustment is performed using the TEG chips.

In manufacturing semiconductor devices, it is an important issue to increase the number of device chips manufacturable from a single semiconductor wafer because it leads to reduction in manufacturing costs. Therefore, there is proposed a method of narrowing the width of a scribe line. However, narrowing the width of a scribe line makes it difficult to form an alignment mark or a TEG chip.

Therefore, it is proposed to adjust $\theta$ of a semiconductor wafer for manufacturing minute device chips by providing an area different from a device chip area on the semiconductor wafer and disposing an alignment mark and a TEG area in the area (see, for example, Japanese Laid-Open Patent Application No. 2001-135569).

The metal of conductive metal patterns of aluminum, an aluminum alloy, etc., disposed in scribe lines and conductive metal such as aluminum, an aluminum alloy, etc., disposed in TEG chips adhere to a dicing cutter at the time of dicing so as to reduce the cutting property of the dicing cutter, thus causing reduction in device reliability due to insulating film cracks formed on the surface of a silicon substrate.

In a manufacturing line of multiple types and multiple chip sizes, it is difficult to adjust the positions and sizes of interconnection lines formed of a conductive material such as aluminum or an aluminum alloy in TEG chips and conductive metal such as aluminum or an aluminum alloy in scribe lines so that the interconnection lines and the conductive metal are prevented from coming into contact with a dicing cutter at the time of dicing.

BRIEF SUMMARY

In an aspect of this disclosure, there is provided a semiconductor wafer including a substrate; a plurality of device chip areas formed on the substrate; a plurality of scribe lines formed in a lattice-like manner on the substrate, the scribe lines being provided so as to separate the device chip areas from each other; a blank area in which at least one alignment mark formed of a metal film for alignment of the semiconductor wafer is formed, the blank area being provided in an area different from the device chip areas; and a scribe area in which the alignment mark is prevented from existing, the scribe area being provided in each area where the blank area crosses the scribe lines.

Since a scribe area in which no alignment mark exists is provided in each area where a blank area crosses scribe lines, it is possible to perform dicing without cutting an alignment mark formed of a metal film, so that there is no adhesion of the metal film to a dicing cutter. Accordingly, it is possible to prevent degradation of the cutting property of the dicing cutter and resultant damage caused in a film formed on a substrate.

In another aspect of this disclosure, there is provided a reticle including a first exposure area and a second exposure area on a light transmitting substrate, the first exposure area having at least a device chip forming area for exposing the device chip areas of a semiconductor wafer according to the present invention, and the second exposure area having at least an alignment mark forming area for forming the alignment mark of the blank area of a semiconductor wafer according to the present invention.

Accordingly, it is possible to expose a device chip forming area and a blank area with a single reticle without changing reticles.

In another aspect of this disclosure, there is provided an exposure method emitting light from a light source onto a reticle and causing the light passing therethrough to expose a predetermined position on a semiconductor wafer, wherein a reticle according to the present invention is employed as the above-described reticle; and the passing light from the second exposure area is blocked in the case of performing exposure by emitting the passing light from the first exposure area onto the semiconductor wafer, and the passing light from the first exposure area is blocked in the case of performing exposure by emitting the passing light from the second exposure area onto the semiconductor wafer.

Accordingly, it is possible to expose a device chip area and a blank area with a single reticle without changing reticles.

BRIEF DESCRIPTION OF THE DRAWINGS

Other aspects, features and advantages will become more apparent from the following detailed description when read in conjunction with the accompanying drawings, in which.

DETAILED DESCRIPTION OF THE PREFERRED EMBODIMENTS

A description is given, with reference to the accompanying drawings, of an embodiment of the present invention.

Figure 1A:
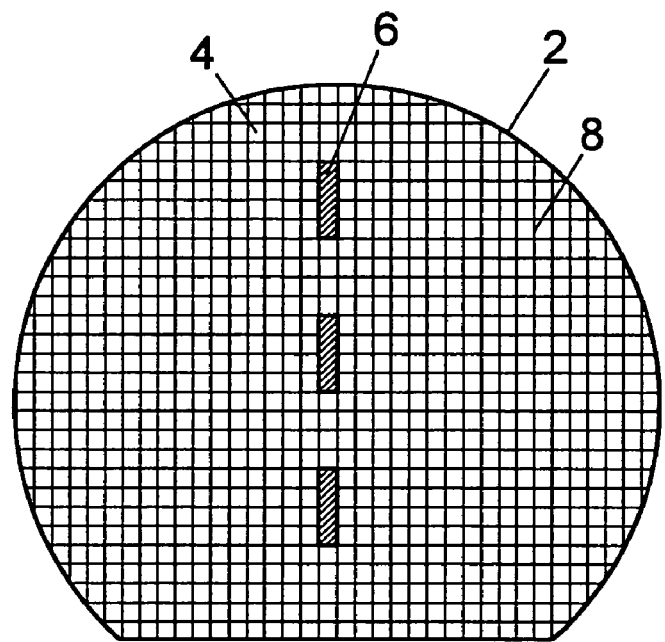
FIG. 1A is a plan view of a semiconductor wafer according to an embodiment of the present invention.
Figure 1B:
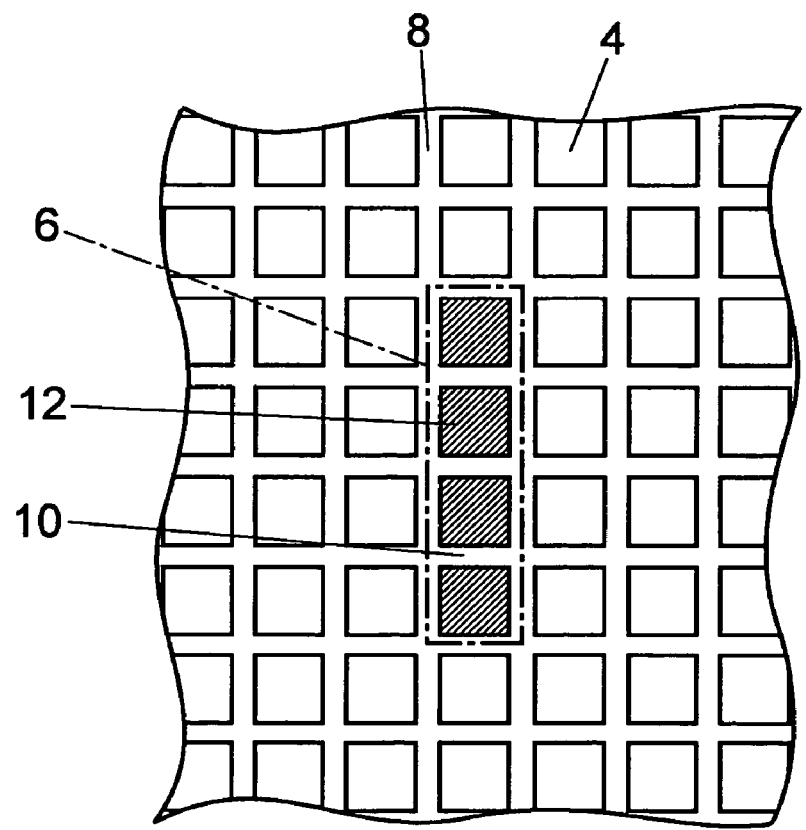
FIG. 1B is an enlarged view of the semiconductor wafer showing the vicinity of a blank area thereof in detail.

A description is given of a semiconductor waver according to the embodiment of the present invention. FIG. 1A is a plan view of a semiconductor wafer 2 according to the embodiment of the present invention. FIG. 1B is an enlarged view of the semiconductor wafer 2, showing the vicinity of one blank area thereof.

As shown in FIG. 1A, the semiconductor wafer 2 has multiple device chip areas 4 for forming device chips formed and disposed in a matrix-like manner on the surface of a silicon substrate. Further, scribe lines 8 for dicing are provided in a lattice-like manner in order to separate these device chip areas 4 from one another. Blank areas 6, in which no device pattern is formed are indicated by oblique strokes. The blank areas 6 are provided in three areas of the semiconductor wafer 2, being spaced apart from one another.

As shown in FIG. 1B, an alignment mark 12 formed of a metal film of, for example, aluminum or an aluminum alloy, is formed in each blank area 6. Further, a scribe area 10 in which the alignment mark 12 does not exist is formed in each area where the blank area 6 crosses the scribe lines 8. The scribe area 10 is formed with the same width as the scribe line 8, and the alignment mark 12 is divided into four portions by the scribe areas 10.

Here, the scribe area 10 according to this embodiment is formed with the same width as the scribe line 8. Alternatively, the scribe area 10 according to the present invention may be formed to be either wider or narrower than the scribe line 8. However, it is necessary for the scribe area 10 to have a greater width than a dicing cutter used in dicing.

Accordingly, each of the four divided portions of the alignment mark 12 may be either larger or smaller in size than one device chip area 4, but is required to have such a size as to allow alignment using the alignment mark 12 (for example, such a size as to be recognizable with an apparatus such as a laser trimming apparatus), for example, 2.5 mm or more in a vertical direction (longitudinal direction) in FIG. 1A.

In this embodiment, the blank area 6 has four device chip areas 4 including scribe lines 8 arranged in a row. However, the present invention is not limited to this, and the blank area 6 may have either three or less device chip areas 4 arranged in a row or five or more device chip areas 4 arranged in one or two rows. However, since more device chip areas 4 can be disposed with a smaller area of the blank area 6, it is preferable that the blank area 6 have four device chip areas 4 arranged in a row.

Figure 2:
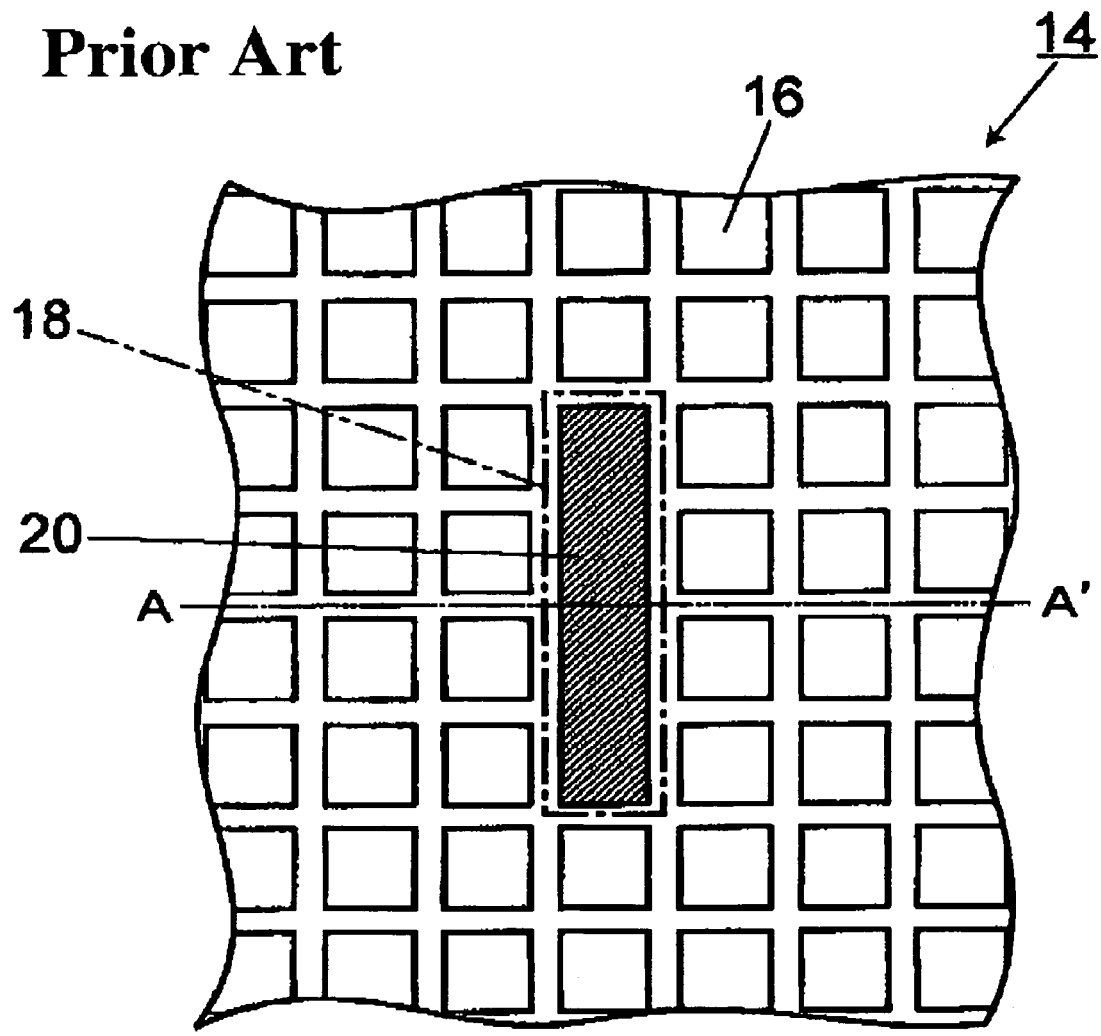
FIG. 2 is an enlarged view of the vicinity of a blank area of a conventional semiconductor wafer for illustrating the blank area.

FIG. 2 is an enlarged view of the vicinity of an alignment mark for illustrating a conventional semiconductor wafer.

As an alignment mark 20, a metal film of, for example, aluminum, is formed over the area corresponding to four device chip areas 16. The alignment mark 20 is formed in a blank area 18 as shown in FIG. 2 so as to be used for image contrast in orthogonal alignment using an image in laser trimming.

However, in the case of performing dicing along A-A' in such a manner as to pass through the blank area 18 of the conventional semiconductor wafer 14, the alignment mark 20 formed in the blank area 18 should be cut. Cutting the alignment mark 20 causes a metal film to adhere to the dicing cutter, so that the cutting property of the dicing cutter is degraded, thus causing a problem in that cracks are generated in the insulating film formed on the surface of a silicon substrate.

According to the semiconductor wafer 2 (FIG. 1B) of this embodiment, the scribe areas 10 in which the alignment mark 12 does not exist are formed parallel to the scribe lines 8 and on the extensions of the scribe lines 8 in the blank area 6. Therefore, even if dicing is performed in the same conventional manner, it is possible to perform dicing without cutting the alignment mark 12. Accordingly, there is no adhesion of a metal film to the dicing cutter. Therefore, it is possible to prevent the cutting property of the dicing cutter from being degraded, and it is also possible to solve the problem of generation of cracks in the insulating film formed on the surface of a silicon substrate.

Figure 3A:
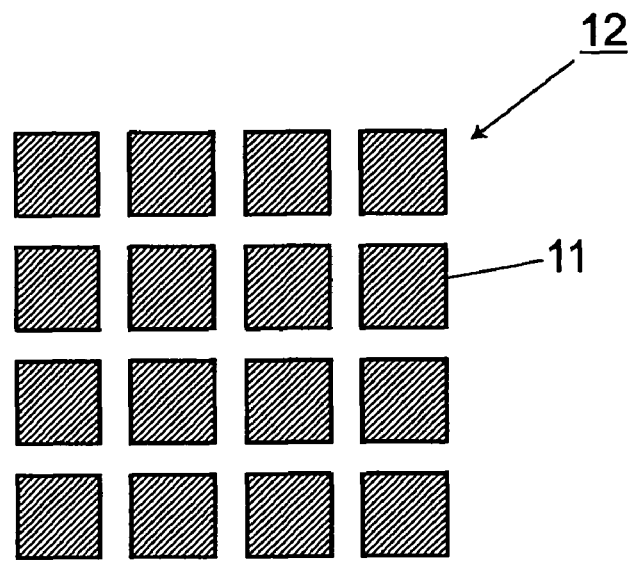
FIGS. 3A through 3C are diagrams for illustrating patterns of an alignment mark formed on the semiconductor wafer according to the embodiment of the present invention.
Figure 3B:
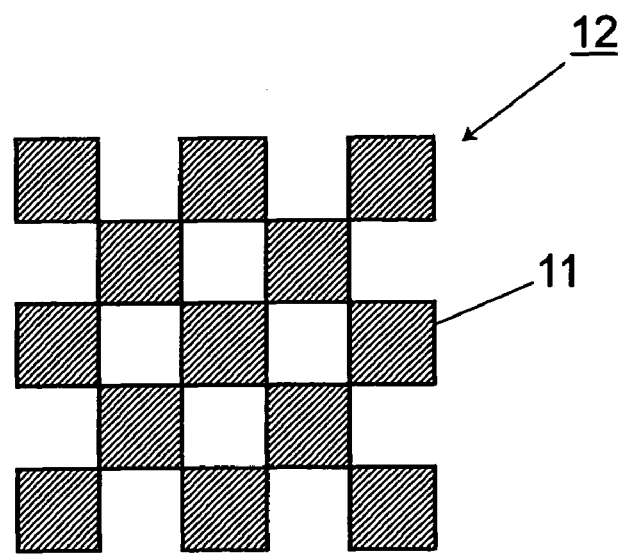
Figure 3C:
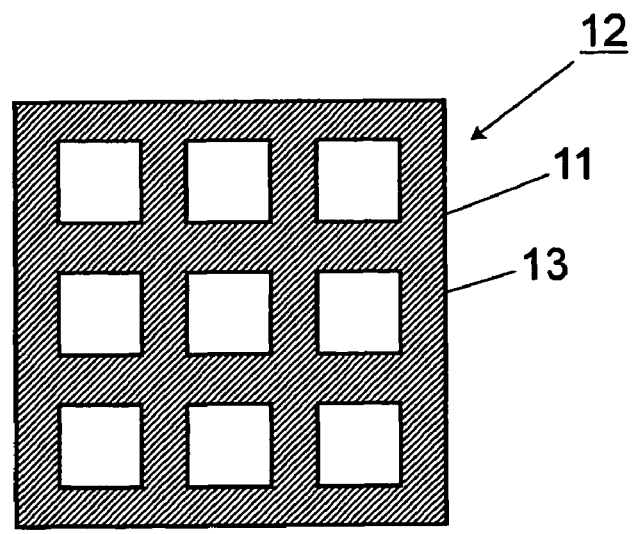

Further, in the area corresponding to one device chip area 4 in the blank area 6, the alignment mark 12 is formed of multiple metal film patterns 11 as shown in, for example, FIGS. 3A through 3C, and the metal film patterns 11 are disposed separately from one another or disposed so that at least one of the metal film patterns 11 is continuous with another one of the metal film patterns 11.

According to the alignment mark 12 shown in FIG. 3A, the squarely formed metal film patterns 11 are disposed independent of one another, and one side of each metal film pattern 11 is equal to or less than, for example, 10 μm.

According to the alignment mark 12 shown in FIG. 3B, the squarely formed metal film patterns 11 are disposed in a checker flag-like manner with each of the metal film patterns 11 being in contact with another one of the metal film patterns 11 at a corner thereof. One side of each metal film pattern 11 is equal to or less than, for example, 10 μm.

According to the alignment mark 12 shown in FIG. 3C, the four rectangular metal film patterns 11 are disposed so as to surround a peripheral part in this area, and the four metal film patterns 11 are continuous with one another. Further, inside them, the rectangular metal film patterns 11 are disposed vertically and laterally in a lattice-like manner so as to be in contact with another one of the metal film patterns 11. That is, the lattice-like metal film patterns 11 having multiple openings 13 each forming a square whose one side is, for example, approximately 10 μm in length, are formed.

However, the above-described alignment marks 12 merely show dispositions of the metal film patterns 11. For example, the shapes of the metal film patterns 11 of FIGS. 3A and 3B and the shapes of the openings 13 of FIG. 3C may be changed to various shapes other than squares, such as rectangles, diamonds, and circles. Further, the dimensions of the metal film patterns 11 and the openings 13 are values that can be considered preferable, which do not limit the present invention.

As described above, by causing the alignment mark 12 formed in the blank area 6 to be formed of the metal film patterns 11 and disposing the metal film patterns 11 so that the metal film patterns 11 are separated from one another or at least one of the metal film patterns 11 is continuous with another one of the metal film patterns 11, it is possible, for example, to approximate the area ratio of the metal film in the blank area 6 to the area ratio of the metal film in the device chip area 4, so that it is possible to set substantially the same polishing rate for the device chip area 4 positioned in the vicinity of the blank area 6 and the device chip area 4 positioned in another area in performing a surface planarization process such as CMP. As a result, it is possible to control the variations in electrical characteristics among device chips due to the difference in polishing rate.

According to this embodiment, in FIG. 1A, the area corresponding to four device chip areas 4 arranged in a row is defined as one blank area 6. However, a semiconductor wafer according to the present invention may have an area corresponding to three or less (but at least one or more) or five or more device chip areas as a blank area. Further, the shape of the blank area 6 may not be vertically long, but may be laterally long or square.

The blank areas 6 are provided in three areas in the center of the semiconductor wafer 2. It is possible to adjust the position and angle of the semiconductor wafer 2 if the blank areas 6 are provided in two or more areas.

Figure 4:
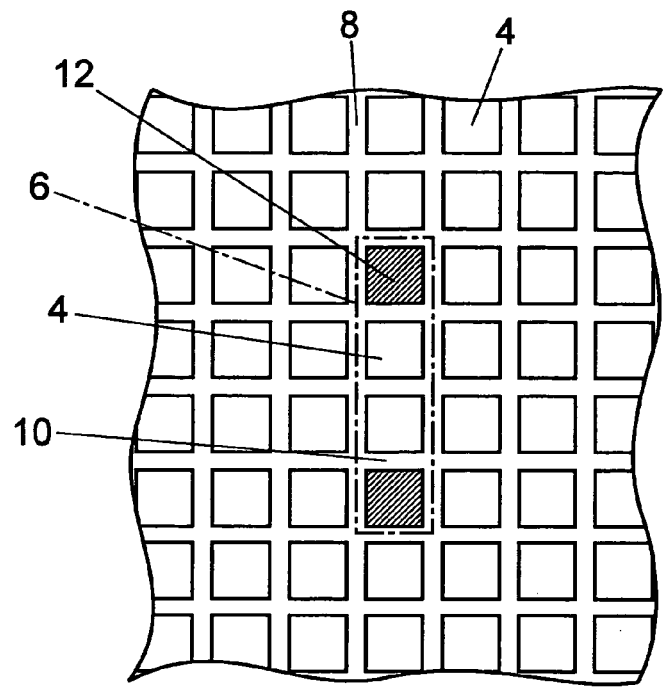
FIG. 4 is an enlarged view of the vicinity of the blank area for illustrating another configuration of the semiconductor wafer according to the embodiment of the present invention.

Further, providing the blank areas 6 reduces the number of device chips formable on the semiconductor wafer 2. Therefore, for example, the device chip areas 4 may be formed in the blank area 6 as shown in FIG. 4. By forming the device chip areas 4 in the blank area 6, it is possible to form more device chip areas 4 on the wafer 2. Accordingly, it is possible to lower cost. However, the alignment mark 12 formed in the blank area 6 is required to have a minimum size necessary to allow adjustment of the position and angle of the semiconductor wafer using the alignment mark 12, for example, a minimum size necessary to be recognizable with a laser trimming apparatus.

Here, in this embodiment, such dispositions of the metal film patterns 11 in the alignment mark 12 as FIGS. 3A through 3C are shown. Likewise, the present invention is also applicable to the alignment mark 12 formed of a single metal film.

Further, the metal film forming the alignment mark 12 may be a metal material other than aluminum and an aluminum alloy, such as copper.

Figure 5:
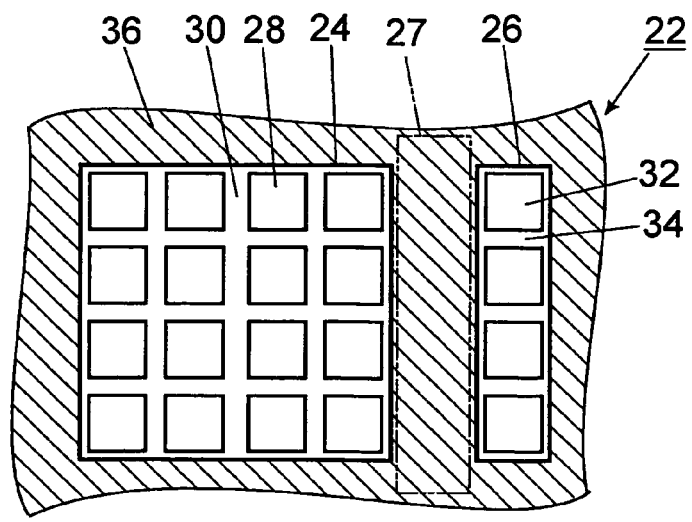
FIG. 5 is a plan view of a reticle according to the embodiment of the present invention.

Next, a description is given of a reticle employed in an exposure apparatus in order to form the above-described semiconductor wafer. FIG. 5 is a diagram showing a reticle according to the present invention. The reticle of this embodiment is a reticle for exposure for forming the above-described semiconductor wafer shown in FIGS. 1A and 1B.

A reticle 22 includes a first exposure area 24 for exposing the device chip areas 4 of the semiconductor wafer 2 (FIGS. 1A and 1B) and a second exposure area 26 for exposing the blank area 6 of the semiconductor wafer 2 on a light transmitting substrate such as a glass substrate. Further, the reticle 22 has a light blocking area 27 for eliminating the misalignment between the reticle 22 and a light blocking blind provided between the first exposure area 24 and the second exposure area 26.

In the first exposure area 24, device chip forming areas 28 for exposing the 4×4 device chip areas 4 in vertical and lateral directions and a scribe line forming area 30 for forming the scribe lines 8 on the semiconductor wafer 2 (FIGS. 1A and 1B) are formed.

In the second exposure area 26, alignment mark forming areas 32 for forming the alignment mark 12 corresponding to the four device chip areas 4 and scribe area forming areas 34 corresponding to the scribe areas 10 are formed in order to expose the blank area 6 on the semiconductor wafer 2.

Here, the scribe area forming area 34 has a greater width than a dicing cutter employed in dicing.

In the reticle 22, the light blocking area 27 and an area 36 other than the first exposure area 24 and the second exposure area 26, which is indicated by oblique strokes, are a light blocking zone that does not transmit light.

According to the reticle 22 of this embodiment, in the first exposure area 24, at least the scribe line forming area 30 is masked with, for example, chromium, so as not to transmit light. Further, also in the second exposure area 26, at least the scribe area forming areas 34 are masked with, for example, chromium, so as not to transmit light.

Further, in the alignment mark forming areas 32 in the second exposure area 26, an area other than a specific area is masked with, for example, chromium, so as not to transmit light.

Further, the light blocking area 27 is also masked with, for example, chromium.

However, this is an example of the area to transmit light and the area to block light of the reticle, which may be reversed depending on a resist formed on the semiconductor wafer. A resist according to the present invention is not limited to this.

In exposure using the reticle 22, light emitted to the second exposure area 26 is blocked with a light blocking blind at the time of exposing the device chip areas 4 (FIGS. 1A and 1B) of the semiconductor wafer 2, and light emitted to the first exposure area 24 is blocked with a light blocking blind at the time of exposing the blank area 6 (FIGS. 1A and 1B). Since the reticle 22 has the light blocking area 27 between the first exposure area 24 and the second exposure area 26, it is possible to prevent light from being emitted to an area that should be shaded from light even if there is a misalignment between the reticle 22 and the light blocking blind. Preferably, the light blocking area 27 has a dimension at least twice an alignment accuracy offset width (for example, 0.8 mm) caused in an employed exposure apparatus between the first exposure area 24 and the second exposure area 26, for example, a width of 1.6 mm or more.

According to the reticle 22 of this embodiment, the alignment mark forming areas 32 are formed in a row in the second exposure area 26. This minimizes the proportion of the second exposure area 26 while maximizing the area occupied by the first exposure area 24 in the plane of the reticle 22. Accordingly, the number of device chip forming areas 28 that can be disposed with a reticle of the same size is maximized, and the number of device chip areas 4 that can be formed with one exposure is maximized. As a result, throughput in the semiconductor device manufacturing process is improved. The present invention is not limited to this, however, and the alignment mark forming areas 32 may be formed in two or more rows.

Here, in this reticle 22, a pattern for forming metal film patterns (whose graphical representation is omitted) is formed in the second exposure area in order to form the alignment mark 12 as shown in FIGS. 3A through 3C, formed by disposing the metal film patterns 11, in the blank area 6 of the semiconductor wafer 2 (FIGS. 1A and 1B).

However, although a pattern for forming metal film patterns is formed in the second exposure area in the reticle 22 of this embodiment, a pattern for forming the alignment mark 12 formed of a single metal film in the second exposure area may be formed in a reticle according to the present invention.

The numbers and sizes of device chip forming areas 28 and alignment mark forming areas 32 formed in the reticle 22 of this embodiment are merely examples, and a reticle according to the present invention may have either more or less device chip forming areas and alignment mark forming areas formed therein than the reticle 22 of this embodiment.

Further, for example, the blank area 6 shown in FIG. 4 may be formed by causing the alignment mark 12 formed in the second exposure area 26 to have a minimum size recognizable with a laser trimming apparatus and forming the device chip forming areas 28 in the remaining area. Forming the device chip forming areas 28 in the blank area 6 makes it possible to form more device chips with the single semiconductor wafer 2, thus making it possible to reduce cost.

By providing the single reticle 22 with the first exposure area 24 for exposing device chip areas and the second exposure area 26 for exposing a blank area as the reticle 22 of this embodiment, it is possible to expose the device chip areas and the blank areas of a semiconductor wafer with the single reticle 22 without changing reticles.

Figure 6A:
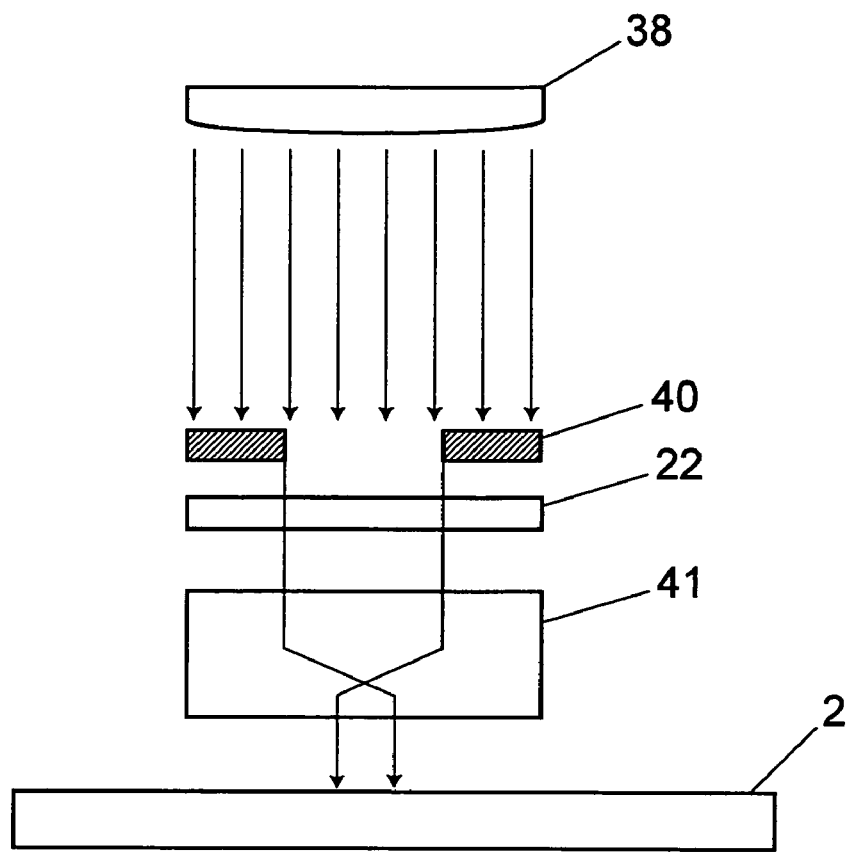
FIGS. 6A and 6B are diagrams for illustrating an exposure apparatus according to the embodiment of the present invention.
Figure 6B:
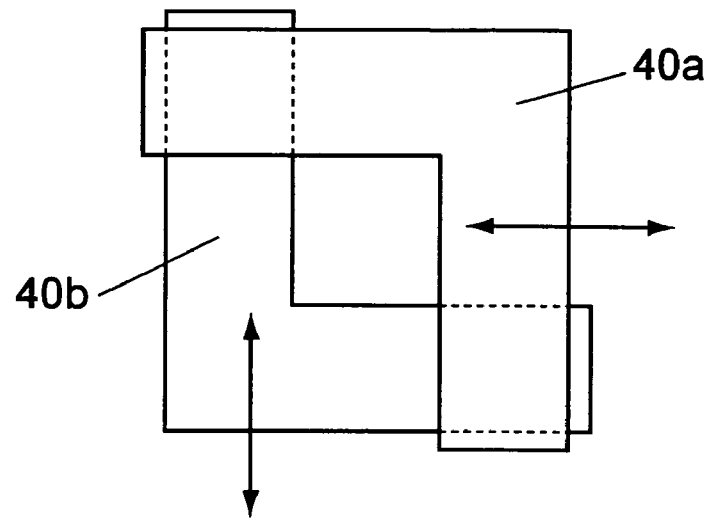

Next, a description is given of an exposure method using the above-described semiconductor wafer and reticle. FIGS. 6A and 6B are diagrams for illustrating the exposure method. FIG. 6A is a schematic diagram showing an exposure apparatus, and FIG. 6B is an enlarged view for illustrating a light blocking blind.

As shown in FIG. 5, the first exposure area 24 and the second exposure area 26 are formed in the reticle 22 of this embodiment. The first exposure area 24 is used in pattern exposure in the device chip areas 4 of the semiconductor wafer 2, and the second exposure area 26 is used in exposing the blank areas 6 of the semiconductor wafer 2.

According to the exposure apparatus, for example, as shown in FIG. 6A, a light source 38 is disposed so as to emit light onto the upper surface of the reticle 22, and a light blocking blind 40 for blocking light emitted to an area in the plane of the reticle 22 is disposed between the light source 38 and the reticle 22. The semiconductor wafer 2 is disposed below the reticle 22 with a reduction projection lens 41 therebetween. As a result, the light from the light source 38 passing through an area of the reticle 22 has the pattern of the reticle 22 reduced to one fifth thereof through the reduction projection lens 41, and is further converted into parallel light to expose a predetermined area of the semiconductor wafer 2.

The light blocking blind 40 includes, for example, two L-shaped light blocking plates 40a and 40b as shown in FIG. 6B, and can block light emitted to any area by sliding the two L-shaped light blocking plates 40a and 40b.

According to the exposure method of this embodiment, light emitted to the second exposure area 26 is blocked with the light blocking blind 40 at the time of exposing the device chip areas 4 (FIGS. 1A and 1B) of the semiconductor wafer 2, and light emitted to the first exposure area 24 is blocked with the light blocking blind 40 at the time of exposing the blank area 6 (FIGS. 1A and 1B) of the semiconductor wafer 2. This makes it possible to expose the device chip areas 4 and the blank areas 6 with the single reticle 22 without changing reticles. Accordingly, it is possible to improve the efficiency of exposure in the semiconductor wafer manufacturing process.

Since a light blocking area is provided between the first exposure area 24 and the second exposure area 26 in the reticle 22 employed in the exposure method of this embodiment, even if there is a misalignment between the reticle 22 and the light blocking blind 40, it is possible to perform exposure without being affected thereby.

Further, performing exposure using the reticle 22 makes it possible to leave no metal film in the scribe areas 10 by performing photolithography and etching even if a metal film for forming an alignment mark or a wiring pattern is formed on the entire upper surface of the semiconductor wafer. Therefore, it is possible to perform dicing without a dicing cutter cutting the metal film. Accordingly, it is possible to prevent degradation of the cutting property of the dicing cutter and resultant generation of cracks in the insulating film on the semiconductor wafer (see also FIGS. 1A and 1B).

In the above-described embodiment, a description is given based on the assumption that planarization is performed using a CMP process. However, the present invention is not limited to this, and is also applicable to a semiconductor device manufacturing process that does not include planarization.

According to one embodiment of the present invention, there is provided a semiconductor wafer including a substrate; multiple device chip areas formed on the substrate; multiple scribe lines formed in a lattice-like manner on the substrate, the scribe lines being provided so as to separate the device chip areas from each other; a blank area in which at least one alignment mark formed of a metal film for alignment of the semiconductor wafer is formed, the blank area being provided in an area different from the device chip areas; and a scribe area in which the alignment mark is prevented from existing, the scribe area being provided in each area where the blank area crosses the scribe lines.

Since a scribe area in which no alignment mark exists is provided in each area where a blank area crosses scribe lines, it is possible to perform dicing without cutting an alignment mark formed of a metal film, so that there is no adhesion of the metal film to a dicing cutter. Accordingly, it is possible to prevent degradation of the cutting property of the dicing cutter and resultant damage caused in a film formed on a substrate.

Further, the scribe area may be a linear area having the same width as the scribe lines.

By causing the scribe area to be a linear area having the same width as the scribe lines, patterning of the scribe area can be performed in the same manner as patterning of the scribe lines, thus facilitating processing.

Further, in the case of flattening a semiconductor wafer on which device chips are formed by exposure, if, for example, a CMP (Chemical Mechanical Polishing) process is applied to multilayer aluminum or aluminum alloy interconnections, there is a problem in that there is a difference in the rate of polishing an insulating film between a device chip area near a blank area and other device chip areas so that device chips disposed near the blank area are more polished than other device chips, thus causing variations in electrical characteristics.

This is because the difference in polishing rate is caused because, for example, the area occupied by a metal film of aluminum or an aluminum alloy in a part of the blank area other than the scribe lines is significantly different (in the amount of unevenness) from the area occupied by a metal film in device chips. This even affects device chips disposed near the blank area.

Therefore, in a semiconductor wafer according to the present invention, it is preferable that the alignment mark be formed of multiple metal film patterns, the metal film patterns being disposed separately from each other or with one of the metal film patterns being continuous with another one of the metal film patterns.

This makes it possible, for example, to approximate the area ratio of a metal film in the blank area to the area ratio of a metal film in the device chip area, so that it is possible to set substantially the same surface polishing rate for the device chip area positioned in the vicinity of the blank area and the device chip area positioned in another area in performing a surface planarization process such as a CMP process. As a result, it is possible to control the variations in electrical characteristics between the device chip area positioned in the vicinity of the blank area and the device chip area positioned in another area.

Further, it is preferable that the blank area have the same size as one of the device chip areas or have the size of two or more of the device chip areas disposed in a row.

This makes it possible to provide the blank area with a minimum necessary size, so that it is possible to form more device chip areas on the semiconductor wafer. Thus, it is possible to reduce cost.

Here, the size of two or more of the device chip areas disposed in a row includes the width of the scribe line between adjacent device chip areas.

According to one embodiment of the present invention, there is provided a reticle including a first exposure area and a second exposure area on a light transmitting substrate, the first exposure area having at least a device chip forming area for exposing the device chip areas of a semiconductor wafer according to the present invention, and the second exposure area having at least an alignment mark forming area for forming the alignment mark of the blank area of a semiconductor wafer according to the present invention.

Accordingly, it is possible to expose a device chip forming area and a blank area with a single reticle without changing reticles.

It is preferable that the reticle include a light blocking area between the first exposure area and the second exposure area.

Without a light blocking area between a first exposure area and a second exposure area, for example, if there is a misalignment between a reticle and a light blocking blind at the time of blocking light to the second exposure area with the light blocking blind, the light is emitted to part of the second exposure area, thus causing a problem in that the light transmitted from the part of the second exposure area is emitted to an area of a semiconductor wafer which area should not be exposed.

Therefore, in a reticle according to the present invention, a light blocking area is provided between the first exposure area and the second exposure area. As a result, even if there is a misalignment between the reticle and the light blocking blind at the time of exposure, it is possible to prevent light transmitted from an area on the reticle which area should be shaded from being emitted onto the semiconductor wafer. Accordingly, it is possible to prevent reduction in yield.

It is preferable that the light blocking area have a dimension between the first exposure area and the second exposure area, the dimension being at least twice the alignment accuracy offset width between the reticle and a light blocking blind.

As a result, it is possible to ensure elimination of the problem in that light transmitted from an area that should be shaded is emitted onto a semiconductor wafer because of a misalignment between a reticle and a light blocking blind. Here, the alignment accuracy offset width refers to an offset width that can be estimated from the accuracy of alignment of a reticle and a light blocking blind in an exposure apparatus.

Further, in a reticle according to the present invention, it is preferable that the alignment mark forming area have the same size as the device chip forming area, and that the second exposure area have one alignment mark forming area disposed therein or multiple alignment mark forming areas disposed in a row therein.

If an alignment mark forming area has the same size as a device chip forming area, it is easy to dispose a device chip area and a blank area on a semiconductor wafer. Further, if one alignment mark forming area is disposed or multiple alignment mark forming areas are disposed in a row in the second exposure area, the blank area can have a minimum necessary size. Therefore, it is possible to maximize the area of the first exposure area with the same reticle size, so that the number of device chip areas that can be exposed in a single exposure operation is maximized. Accordingly, it is possible to improve throughput.

According to one embodiment of the present invention, there is provided an exposure method emitting light from a light source onto a reticle and causing the light passing therethrough to expose a predetermined position on a semiconductor wafer, wherein a reticle according to the present invention is employed as the above-described reticle; and the passing light from the second exposure area is blocked in the case of performing exposure by emitting the passing light from the first exposure area onto the semiconductor wafer, and the passing light from the first exposure area is blocked in the case of performing exposure by emitting the passing light from the second exposure area onto the semiconductor wafer.

Accordingly, it is possible to expose a device chip area and a blank area with a single reticle without changing reticles.

The present invention is not limited to the specifically disclosed embodiment, and variations and modifications may be made without departing from the scope of the present invention.

The present application is based on Japanese Priority Patent Application No. 2005-217249, filed on Jul. 27, 2005, the entire contents of which are hereby incorporated by reference.

What is claimed is:

1. A semiconductor wafer including a substrate; a plurality of device chip areas formed on the substrate; a plurality of scribe lines formed in a lattice-like manner on the substrate, the scribe lines being provided so as to separate the device chip areas from each other; and a blank area in which at least one alignment mark formed of a metal film for alignment of the semiconductor wafer is formed, the blank area being provided in an area including no device chip areas, the semiconductor wafer further comprising:

a scribe area provided in a portion of the blank area where the blank area crosses the scribe lines, the scribe area dividing the alignment mark into multiple portions within the blank area, wherein the blank area has a size of two or more of the device chip areas disposed in a row, and the blank area is provided in a center of the substrate.

2. The semiconductor wafer as claimed in claim 1, wherein the scribe area is a linear area having a same width as the scribe lines.

3. The semiconductor wafer of claim 1, wherein said at least one alignment mark is configured so that it is not cut during dicing.

4. The semiconductor wafer of claim 1, wherein said blank area is substantially identical in shape to a combination of two or more adjacent ones of said device chip areas and portions of the scribe lines separating said two or more adjacent ones of said device chip areas.

5. The semiconductor wafer of claim 1, wherein said scribe area, said blank area and said scribe lines are areas of the semiconductor wafer that are not limited in a direction normal to the surface of the substrate.

6. The semiconductor wafer of claim 1, wherein said semiconductor wafer includes a plurality of blank areas, and at least one alignment mark formed of a metal film for alignment of the semiconductor wafer is formed in each of the blank areas.

7. The semiconductor wafer as claimed in claim 1, wherein the alignment mark is formed of a plurality of metal film patterns.

8. The semiconductor wafer as claimed in claim 7, wherein the metal film patterns are disposed separately from each other.

9. The semiconductor wafer as claimed in claim 7, wherein one of the metal film patterns is continuous with another one of the metal film patterns.

10. A semiconductor wafer comprising:

a substrate;

a plurality of device chip areas formed on the substrate;

a plurality of scribe lines formed in a lattice-like manner on the substrate, the scribe lines being provided so as to separate the device chip areas from each other;

a blank area in which at least one alignment mark formed of a metal film for alignment of the semiconductor wafer is formed, the blank area being provided in an area including no device chip areas; and a scribe area provided in a portion of the blank area where the blank area crosses the scribe lines, wherein the alignment mark is formed of a plurality of metal film patterns in the blank area, and the blank area is provided in a center of the substrate.

11. The semiconductor wafer as claimed in claim 10, wherein the blank area has a same size as one of the device chip areas or has a size of two or more of the device chip areas disposed in a row.

12. The semiconductor wafer of claim 10, wherein said blank area is substantially identical in shape to one of said device chip areas.

13. The semiconductor wafer as claimed in claim 10, wherein the scribe area is a linear area having a same width as the scribe lines.

14. The semiconductor wafer of claim 10, wherein said at least one alignment mark is configured so that it is not cut during dicing.

15. The semiconductor wafer of claim 10, wherein said blank area is substantially identical in shape to a combination of two or more adjacent ones of said device chip areas and portions of the scribe lines separating said two or more adjacent ones of said device chip areas.

16. The semiconductor wafer as claimed in claim 10, wherein the metal film patterns are disposed separately from each other.

17. The semiconductor wafer as claimed in claim 10, wherein one of the metal film patterns is continuous with another one of the metal film patterns.

* * * * *